Nov. 24, 1959 J. E. LARRISON 2,914,716

SEMICONDUCTOR MOUNTING

Filed May 25, 1956

INVENTOR:
JOHN E. LARRISON,

BY Julius J. Zaskalicky
HIS ATTORNEY.

United States Patent Office 2,914,716

Patented Nov. 24, 1959

2,914,716

SEMICONDUCTOR MOUNTING

John E. Larrison, North Syracuse, N.Y., assignor to General Electric Company, a corporation of New York Application May 25, 1956, Serial No. 587,340

5 Claims. (Cl. 317—235)

This invention relates to semiconductor translating devices of the junction type, and more particularly to means for mounting such devices for facilitating handling during production and in ultimate utilization.

The handling of junction transistors during fabrication poses a difficult problem due to the small size of the devices and the delicacy of the operations which are to be performed thereon. This is particularly true with respect to the attaching and supporting of external electrical leads to the electrodes of the semiconductor body. These external leads are extremely fragile, and great care must be exercised in handling them.

Accordingly, it is an object of this invention to provide a mounting assembly for junction-type semiconductor devices which facilitates ease in handling such devices during fabrication.

A further object of this invention is to provide a mounting assembly for junction transistors which can easily be handled during operations upon the transistor device, such as etching.

Still a further object of this invention is to provide a mounting structure for a junction transistor in which the generally fragile base lead is rigidly supported at all times during the handling of the transistor device.

Another object of this invention is to provide a mounting means for semiconductor devices which is structurally simple, and which lends itself readily to assemblage by machine.

In carrying out the present invention in one form, applicant provides a frame for supporting a semiconductor device in which two end leads and the base lead of the semiconductor are mounted. This produces a sub-assembly which can be easily handled during subsequent operations, such as etching. This sub-assembly is then welded to a header, after which two portions of the frame are removed by a punching operation, for example, leaving the electrodes of the semiconductor device electrically insulated from each other.

These and other objects of this invention will be more clearly understood from the following description taken in connection with the accompanying drawings, and its scope will be apparent from the appended claims.

Figure 1:
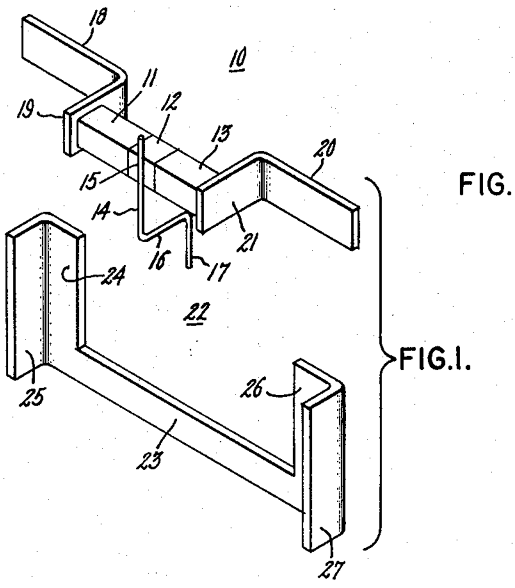
Figure 1 is an exploded isometric view of the elements forming the semiconductor sub-assembly embodied in this invention.

Referring now to Figure 1, there is shown in exploded form an illustrative embodiment of the present invention comprising a junction transistor 10 including an emitter 11, a collector 13 and a base electrode 12, end leads 18 and 20, a base lead 14, and a frame 22. Junction transistor 10 may be either of an N–P–N or P–N–P type, constituted of suitable semiconductor material, such as, for example, germanium or silicon. As is well known to those skilled in the art, an N–P–N transistor is one in which the emitter and collector electrodes are constituted of the N-type conductivity semiconductor material and the base of which is constituted of P-type conductivity material. Similarly, a P–N–P transistor is one in which the emitter and collector electrodes are constituted of P-type conductivity semiconductor material and the base electrode is constituted of N-type conductivity semiconductor material.

End leads 18 and 20 have flanged end portions 19 and 21 thereon. Flanges 19 and 21 are soldered to collector 13 and emitter 11, respectively. Base lead 14 is secured to base electrode 12 along its end portion 15. Frame 22 which consists of a base portion 23 and leg portions 24 and 26 is welded along leg portions 24 and 26 to end leads 18 and 20, respectively, and to base lead 14 at end portion 17 to the base portion 23. This structure is shown in its assembled form in Figure 2. Legs 24 and 26 are provided with flanged portions 25 and 27, respectively, to add rigidity to the frame and to facilitate the attachment of frame 22 to the header assembly which will hereinafter be described.

As will be appreciated by those skilled in the art, the soldering of the base lead 14 to base electrode 12 is a delicate operation due to the small size of base electrode 12 and because of the fragile nature of base lead 14. Although the drawings show base electrode 12 as being substantial in width, it actually consists of a thin wafer of semiconductor material of proper conductivity type. When soldering base lead 14 to base electrode 12, the connection so made tends to extend over an area which includes electrodes 11 and 13 of semiconductor 10. Consequently, a short circuit is provided which renders transistor 10 inoperative.

Figure 2:
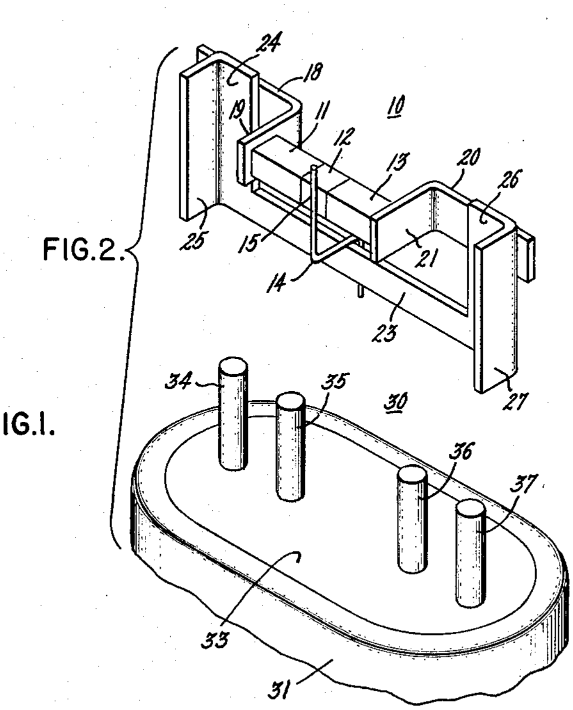
Figure 2 is an exploded isometric view of the semiconductor sub-assembly shown in Figure 1 and in its assembled form and a portion of the header structure.

In order to overcome the aforesaid difficulty, the device is immersed in an acid bath or other suitable solution which etches away the area of the connection between base lead 14 and base 12, thereby eliminating short circuits between the electrodes of the transistor device. As an alternative, electrolyte etching techniques may be employed. The sub-assembly shown in Figure 2 is particularly adapted for the etching process, since the entire sub-assembly may be immersed in the acid bath or particular solution used, depending on the nature of the etching process. This sub-assembly provides a rigid support for base lead 14, so that it is not damaged during the etching operation or in subsequent operations. Frame 22, leads 18 and 20, and base lead 14 are preferably made of nickel or other suitable material which will resist attack by the acid or other solution used in the etching process. It should be noted that base lead 14 is bent at intermediate portion 16 thereon to provide a flexible joint in base lead 14. The flexibility thus obtained allows the base lead to withstand external shock and vibration during the assembly procedure, and when the device is actually utilized in electrical devices.

Figure 3:
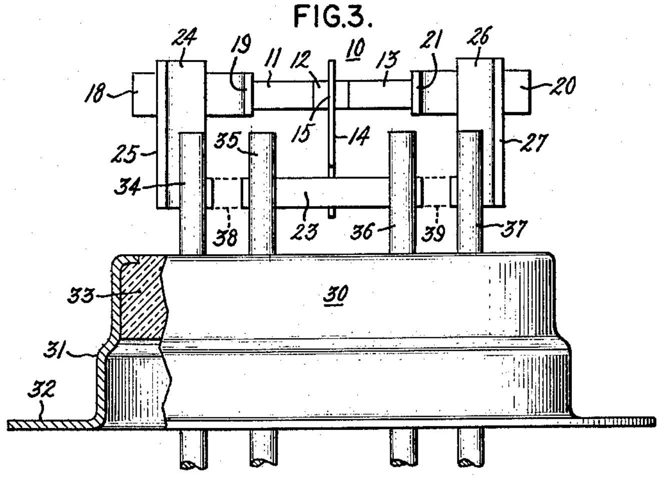
Figure 3 is a front elevational view partly in section showing the entire structure in its assembled form.

Referring now to Figures 2 and 3, a header assembly 30 is shown which is comprised of leads 34, 35, 36 and 37, insulating material 33 and cap 31. The leads, insulating material 33 and cap 31 are molded into position by methods well known in the vacuum tube and transistor art. The main purpose of the header is to provide external connections to the semiconductor device and to seal off the internal connections thereto from the ambient atmosphere.

The sub-assembly shown in Figure 2 is welded to the header assembly. Leads 34 and 37 of the header 30 are welded to frame 22 adjacent legs 24 and 26, respectively, while leads 35 and 36 are welded to the base portion 23 of frame 22 at points intermediate said leg portions. A small space existing between flange 25 and lead 34 and between flange 27 and lead 37 allows for fabricating tolerances. After welding, portions 38 and 39 of frame 22 are removed by a punching operation which leaves leg portions 26 and 24 electrically insulated from the central portion of the frame thereof. This operation effectively isolates the leads which are connected to the various electrodes of transistor 10. It should be noted that the header leads 35 and 36 support the remaining base portion 23 on opposite ends thereof, thus providing a rigid support for the base lead which is attached thereto. The device as thus assembled may be tested. A cup-shaped casing member (not shown) may be welded to the flange portion 32 of cap 31 to hermetically seal the device. A tube (not shown) may be provided on the casing for evacuating the device, if desired.

The aforesaid structure produces an assembly which can be easily handled during fabrication operations. It offers support and protection for the lead connections to the transistor device and particularly to the delicate base lead connection. The semiconductor mounting assembly has the additional advantage of providing easy fabrication by machine.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. Mounting structure for a junction transistor having base, collector and emitter electrodes comprising a first lead connected to said emitter electrode, a second lead connected to said collector electrode, a third lead connected at one end portion to said base electrode, a conductive frame member having a pair of leg portions and a base portion thereon, means securing said first lead to one of said leg portions and said second lead to the other of said leg portions, and means securing said third lead at the other end portion to the base portion of said frame.

2. A semiconductor device comprising a junction transistor having base, emitter and collector electrodes thereon, first and second leads connected to said emitter and collector electrodes respectively, a conductive frame having a base and a pair of leg portions thereon, means for securing said first lead to one of the leg portions of said frame, means for securing said second lead to the other leg portion of said frame, a base lead, means for connecting said base lead to said base electrode on one end portion thereon and to the base portion of said frame at the other end portion thereon, a header having a plurality of spaced leads thereon, means securing said plurality of leads on said header along the base portion of said frame, the outermost leads being secured to said frame adjacent said legs, the remainder of said leads being secured to said frame at intermediate points spaced from said outer leads.

3. Mounting structure for a junction transistor having base, collector and emitter electrodes comprising a first lead having a flanged end portion thereon connected to said emitter electrode, a second lead having a flanged end portion thereon connected to said collector electrode, a third lead having a bent intermediate portion connected at one end portion and on one side thereof to said base electrode, a frame having a pair of leg portions and a base portion thereon, means securing said first lead to one of said leg portions and said second lead to the other of said leg portions, and means securing said third lead at the other end portion and on the other side thereof to the base portion of said frame.

4. A semiconductor device comprising a bar of semiconductor material having therein a first and second zone of one conductivity type and a third zone of opposite conductivity type and forming a pair of junctions with said first and second zones, a generally U-shaped conductive supporting frame having one leg conductively connected to said first zone and the other leg thereof connected to said second zone, and a lead conductively connecting said third zone to the base of said frame.

5. A semiconductor device comprising a bar of semiconductor material having therein a first and second zone of one conductivity type and a third zone of opposite conductivity type and forming a pair of junctions with said first and second zones, a generally U-shaped conductive supporting frame having one leg conductively connected to said first zone and the other leg thereof connected to said second zone, and a lead conductively connecting said third zone to the base of said frame, at least three conductors in rigid relationship with respect to one another, said leads being conductively connected to the base portion of said U-shaped frame, said base portion being completely severed in two places leaving one conductor conductively connected to said third zone and each of the other conductors connected to a respective zone of one conductivity type.

References Cited in the file of this patent

UNITED STATES PATENTS

| | | |
|---|---|---|
| 2,748,235 | Wallace | May 29, 1956 |
| 2,796,563 | Ebers et al. | June 18, 1957 |
| 2,830,920 | Colson et al. | Apr. 15, 1958 |